United States Patent
Melcher et al.

[11] Patent Number: 5,952,829
[45] Date of Patent: Sep. 14, 1999

[54] PROCESS AND DEVICE FOR MAGNETIC RESONANCE EXAMINATIONS

[75] Inventors: Jörg Melcher, Lehre; Rolf Lammering, Meine, both of Germany; Eric M. Flint, Mountain View, Calif.

[73] Assignee: Deutsche Forschungsanstalt fur- Luft und Raumfahrt e.V., Bonn, Germany

[21] Appl. No.: 08/954,845

[22] Filed: Oct. 21, 1997

[30] Foreign Application Priority Data

Oct. 21, 1996 [DE] Germany .......................... 196 43 116

[51] Int. Cl.$^6$ ...................................................... G01V 3/175
[52] U.S. Cl. .................... 324/318; 324/318; 324/319; 324/320; 324/322; 324/307; 324/300
[58] Field of Search .................... 324/318, 319, 324/320, 322, 307, 300

[56] References Cited

U.S. PATENT DOCUMENTS 5,502,781  3/1996  Li et al. .................................. 324/385

FOREIGN PATENT DOCUMENTS 44 32 747  3/1995  Germany .
44 32 747 A1  3/1995  Germany .

OTHER PUBLICATIONS

"Smart Materials & Structures," *Institute of Physics Publishing*, vol. 4, Supplement 1A, Mar., 1995.

*Primary Examiner*—John Barlow
*Assistant Examiner*—Brij B. Shrivastav
*Attorney, Agent, or Firm*—Salter & Michaelson

[57] ABSTRACT

The invention relates to a process for magnetic resonance examinations, in particular nuclear spin tomography, whereby a static magnetic field is produced in an examination zone and at least one gradient magnetic field is superposed, whereby unwanted alternating electromagnetic forces are produced, whereby by means of magnetostriction, forces opposing the electromagnetic forces are produced by the same gradient magnetic field and these forces act longitudinally and/or radially and/or around the circumference of the examination zone. Furthermore, the invention relates to a device for magnetic resonance examinations, in particular nuclear spin tomography, with a first generating unit for a static magnetic field, a second generating unit (20) for at least one gradient magnetic field and a support unit (10) for the second generating unit (20), whereby a magnetostrictive material system (11, 12) is provided on the support unit (10).

16 Claims, 1 Drawing Sheet

PROCESS AND DEVICE FOR MAGNETIC RESONANCE EXAMINATIONS

The invention relates to a process for magnetic resonance examinations, in particular nuclear spin tomography, whereby a static magnetic field is produced in an examination zone and at least one gradient magnetic field is superposed, whereby unwanted alternating electromagnetic forces are produced, and the invention also relates to a device for magnetic resonance examinations, in particular nuclear spin tomography, with a first generating unit for a static magnetic field, a second generating unit for at least one gradient magnetic field and a support unit for the second generating unit.

Magnetic resonance examinations allow solid, liquid or gaseous specimens to be examined. In the examination process, which is also referred to as nuclear spin resonance spectroscopy, specific atomic nuclei contained in the specimens are stimulated in a static magnetic field. The nuclear spins thereby—process from a traditional viewpoint—around the direction of the static magnetic field. The nuclear magnetic resonance is based upon a property of the atomic nucleus, namely the spin, whereby nuclei in strong magnetic field can absorb and emit energy in the form of electromagnetic waves in the radio frequency field. When observing the effects, a specific type of atom is constantly used. The resonance frequency is proportional to the strength of the magnetic field at the location of the nucleus, whereby the gyromagnetic ratio $\gamma$ is the nuclear physical natural constant. Hydrogen nuclei have the strongest resonance effect (greatest sensitivity). Their resonance frequency is, for example, 21.3 MHz at 0.5 Tesla, 42.6 MHz at 1.0 Tesla and correspondingly 64 MHz at 1.5 Tesla. The nuclear spin resonance is stimulated by high-frequency magnetic alternating fields in the directions x, y and z. If the resonance frequency and the frequency of the external field coincides, the nuclear magnetisation of the specimen or the tissue is spun out of (removed from) the field. The magnitude of the excursion of charge characterises the stimulation pulse.

Taking into consideration various effects (magnetisation, longitudinal and transverse relaxation), the high-frequency signals must be spatially related to the object in order to provide a picture. In principle, therefore, a "field gradient" is established both at the point of stimulation and of signal output. This field gradient corresponds to a defined linear change in the magnetic field strength in a spatial direction. The resonance frequency $\omega$, then, is a function of the x co-ordinates, e.g.

$$\omega(X)=\gamma+G_x+X \text{(Larmor relation with gradient } G_x\text{).}$$

Magnetic resonance examination processes of this nature are used mainly in medicine. Nuclear spin resonance spectroscopy facilitates non-invasive examination of the human metabolism. In addition, magnetic resonance examination processes are used in atomic and nuclear physics as well as in solid-state physics.

In clinical magnetic resonance spectroscopy itself, the information concerning the metabolism of a specific tissue, i.e. the physical analysis of the magnetic resonance device, must be optimised. Depending upon the application, therefore, various localisation techniques (stimulation of specific layers, phase coding, restricted field of sensitivity of upper surface coils, and combinations of these techniques) are used. It is thereby easy to show that the analysis depends to a large extent upon the signal sequences which feed the gradient coils. The greater the ration between the amplitude of the pulse and the rise time, the better the resolution. It is thus advantageous to use high amplitudes with short rise times.

Typical magnetic resonance installations have a tubular system and the patient is pushed into the centre of this system. The magnetic fields are electrically produced by coil systems which are integrated into the tubular system.

The currents I produce the magnetic field of the magnetic induction B. Due to the moved charge in the magnetic field, electromagnetic forces are produced, i.e. Lorentz forces F. The magnitude of these Lorentz forces is maximal perpendicular to the magnetic field and to the current direction. The conductors, i.e. the coils in this case, experience F in such a way that they for their part can produce structural vibrations, namely the inherent or characteristic shapes (eigenforms) of the tubular system. These vibrations are always accompanied by a non-negligible emission of air noise. The entire pipe system thereby operates—from an acoustic viewpoint—as a loud speaker membrane. Due to the extremely high currents which flow through the coils, the forces and hence the sound pressure are high. Such sound pressure of 120 dB and above not only makes the patient feel anxious and threatened, but it can also be life-threatening.

Therefore, a passive car protection device, directly against the human ear, is clearly no longer sufficient. As a further passive measure, it was suggested that the tubular system containing the gradient coils should be mechanically reinforced. The results achieved to date, however, are unsatisfactory.

DE 44 32 747 A1 thus disclosed a nuclear spin tomography device and process with active noise dampening. Piezoelectric components are attached, without dampening, to a support component containing the gradient magnetic field coil. A voltage is fed to these piezoelectric components, which change shape as a result. The change of shape produces a force which is transmitted to the support component. Substantially this prevents a change of shape of the support component whereby the voltage fed to the piezoelectric component is suitably controlled. The piezoelectric components are either controlled in accordance with a control curve which has been experimentally adapted and stored for certain determined stimulation signal sequences of the gradient coils, or they are controlled on the basis of measurement results of a device which measures changes in shape and is situated in the support component. The disadvantage is the considerable amount of control for the piezoelectric components, which means that this system is very expensive.

Furthermore, the article "Vibration Control of a Cylindrical Shell Used in MRI Equipment" by Qui, J. and Tani, J. in: Smart Materials and Structures, Vol. 4, Pages A75–A81, 1995, disclosed active vibration dampening of cylindrical shells in magnetic resonance devices. In order to dampen the vibrations of the cylindrical shell itself, a multitude of piezoelectric actuators are located at appropriate positions. Once again, the disadvantage is the considerable amount of equipment and control required.

It is thus an object of the invention to reduce the sound pressure produced during magnetic resonance examinations in an effective way and with justifiable resources.

According to the invention, this object is achieved by producing forces through magnetostriction whereby these forces have a component opposing the electromagnetic forces, are produced by the same gradient magnetic field and exert action longitudinally and I or radially and I or around the circumference or periphery of the examination zone.

According to the invention, the object is achieved by providing a magnetostrictive material system on the support unit of a standard device.

With this process and this device, the sound levels produced by vibrations on tomographs are considerably reduced by an active or dynamic reinforcement of the system.

According to the process of the invention, the forces produced through magnetostriction are substantially opposed to the electromagnetic forces. In a preferred embodiment of the invention, the forces with the opposing components are produced through dimensional variations of the magnetostrictive materials which produce magnetostriction. In a preferred embodiment of the invention, the magnitude and direction of the opposing forces is determined by the form and layout of the magnetostrictive materials. In a preferred embodiment of the invention, the magnitude of the opposing forces is regulated by a mechanical or electromagnetic bias or prestress of the magnetostrictive materials.

According to a preferred embodiment of the invention, the magnetostrictive material system consists of magnetostrictive components which are either extended along the surface or arranged in strips. In a preferred embodiment of the invention, in the case of a cylindrical support unit, the magnetostrictive components are attached to the cylindrical shell or surface, parallel to the axis in a longitudinal direction.

In order to allow good adaptation to the shell or surface, the use of magnetostrictive components extended along the surface or arranged in strips has proved very advantageous.

In a preferred embodiment of the invention, however, the magnetostrictive components can alternatively be attached to the cylindrical shell or surface in a ring around the circumference. In a preferred embodiment of the invention, the magnetostrictive material system is mechanically biassed and attached to the support unit. In a preferred embodiment of the invention, in order to keep to a minimum the expenditure on additional auxiliary materials, the magnetostrictive material is biassed through the static magnetic field and positioned on the support unit. In a preferred embodiment of the invention, displacement and/or force transmission units are provided on the magnetostrictive material system for measuring purposes and control.

In a preferred embodiment of the invention, the magnetostrictive material consists of alloys of the metals Fe (iron), Ni (nickel), Co (cobalt) and / or the rare earths (lanthanide), Sm (samarium), Tb (terbium), and Ho (holmium), Dy (dysprosium), Er (erbium) and / or Tm (thulium).

The electromagnetic forces produced by the highly variable magnetic alternating field (gradient magnetic field) give rise to an unwanted emission of sound. In the process according to the invention, therefore, forces opposing the electromagnetic forces are produced. This occurs through magnetostriction caused by the alternating field of the gradient magnetic field. In a preferred embodiment of the invention, the opposing forces are produced by dimensional changes of magnetostrictive materials. By means of an appropriate formation of the magnetostrictive materials and, in particular, an appropriate layout of these magnetostrictive materials, the magnitude and direction of the opposing forces can be precisely adapted to suit the application. In addition, it is possible to regulate the opposing forces by a mechanical or electromagnetic bias of the magnetostrictive materials. If the magnetostrictive or electrostrictive material is clamped, this leads to the production of force, in contrast to a mere fixing on one side, whereby only an excursion or deflection occurs. In contrast to the state of the art, a maximum of 20 kN instead of the usual 2 to 3 kN can thereby be produced.

On the magnetic resonance examination installation, a magnetostrictive material system is provided on a support unit for the coil which produces the gradient magnetic field. The magnetostrictive material system is attached to the support unit in such a way that it counteracts the primary Lorentz forces, which exert action with the alternating magnetic field on the conductors of the coil through which current flows. The installation of the magnetostrictive material system on the support unit dampens or reduces, respectively, the primary vibrations and thus the sound emission. The magnetostrictive material system is thereby promoted by the static and in particular the gradient magnetic field. The dimensional changes that arise in the alternating magnetic field of the magnetostrictive material thereby produce the opposing mechanical force, which thus stabilises the device dynamically or actively.

In a preferred embodiment of the invention, the magnetostrictive material is arranged in such a way that the forces produced oppose the Lorentz forces. However, it is possible that the layout of the magnetostrictive material may be inclined, or may not be exact or optimal, and this is to be taken into account in certain circumstances for special applications.

If the magnetostrictive material system consists of magnetostrictive components which are either extended along the surface or arranged in strips, the opposing forces can be easily selected or coordinated according to magnitude and direction.

In a preferred embodiment of the invention, the support unit is cylindrical for second magnetic field generating units formed as gradient coils. With such a support unit, magnetostrictive components, which are attached to the cylindrical shell parallel to the axis in a longitudinal direction, pick up in particular bending forces along the cylinder axis. These longitudinal reinforcements or stringers are to be provided as a priority, as the vibration amplitudes of the axial eigenforms (so-called banana modes) are very great.

The greatest elongations arise from the inherent or characteristic shapes (eigenforms) and they occur in longitudinal, circumferential and radial directions. In a preferred embodiment of the invention, therefore, the forces produced by magnetostriction advantageously exert action in these directions. In a preferred embodiment of the invention, the magnetic field is also an energy source for the magnetostrictive actuators, whereby sensors, actuators as well as control mechanisms are united into one.

In a preferred embodiment of the invention, in order to increase the transverse rigidity, the magnetostrictive components are advantageously attached to the cylindrical shell in a ring around the circumference. Such transverse reinforcements dampen the radial self-resonances of the cylindrical support unit.

A significant aspect of the dynamic reinforcement according to the invention is the junction between the support unit and the magnetostrictive material system. This junction has to transmit the flow of force in the appropriate direction. In a preferred embodiment of the invention, therefore, in order to regulate the opposing forces as desired, the magnetostrictive material system is advantageously mechanically biassed and attached to the support unit and / or the magnetostrictive material system is biassed through the magnetic field and positioned on the support unit. Furthermore, the opposing force exerting action mechanically can be amplified on the magnetostrictive material system through displacement and/ or force transmission units. In total, therefore, both the magnitude and the direction of the opposing forces can be adapted to the vibrations of the device.

Magnetostrictive alloys are ferromagnetic, which means that they must be taken into account in calculating the magnetic field when the device is designed. If a terro-electric material is used, a change occurs in the magnetic field when the material is added. A correction is thus necessary. An advantage arising from the change in the magnetic field, however, is the reduction in vibrations and sound. The form of the correction coils must be changed accordingly. The material system can be assembled in such a way that the magnetostrictions represent only one component or several components. This is particularly advantageous when an actuator system is produced through the displacement and/or force transmission units of the magnetostrictive material.

Below, an embodiment of the invention is described in detail by reference to the drawings.

FIG. 1 shows a perspective view of a cylindrical support unit 10, in a partly cut-away representation with magnetostrictive components 11, 12.

Figure 2:
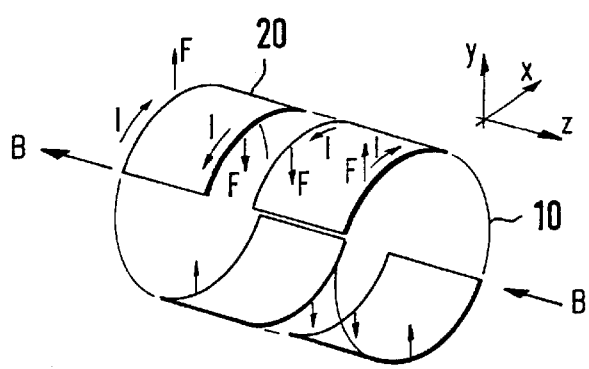
FIG. 2 shows a schematic three-dimensional perspective view of a gradient coil.

In existing magnetic resonance tomographs, coils are specially arranged on a cylindrical support unit for the purpose of producing the gradient magnetic fields. In FIG. 2, a pair of gradient coils 20 is shown in a schematic, three-dimensional perspective. The pair of gradient coils 20 produces a gradient magnetic field in Y direction in accordance with the co-ordinate system illustrated in the top right-hand corner of FIG. 2. A corresponding pair of gradient coils for producing a gradient magnetic field in X direction is similarly positioned on the shell of the support unit 10 at an angle of 90° wound around the Z axis which coincides with the cylinder axis. The gradient coils for the X direction and for the Y direction are in this example both saddle coils, which lie opposite one another in pairs. Besides these typically used saddle coils, however, other coil types could be used.

For the sake of clarity, the Z gradient coil is not illustrated in FIG. 2. The Z gradient coil is would around the cylindrical support unit 10. In the half of the coil where Z>0, the coil conductor is wound in one direction and in the other half of the coil it is wound in the opposite direction. Together, the two halves of the coil produce a linear gradient field along the Z axis.

Figure 3:
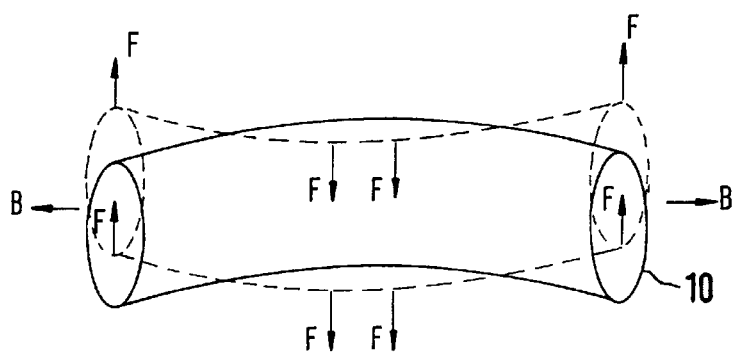
FIG. 3 shows the change of shape of a cylindrical support unit upon the application of force in accordance with FIG. 2.

If a force is fed into the arrangement as shown in FIG. 2, this gives rise to a change of shape in the form of an inherent or characteristic shape (eigenform). In FIG. 3, such and "eigenform" is illustrated as a so-called banana mode.

Furthermore, in FIG. 2, a current I which produces the gradient magnetic field of the magnetic induction H is illustrated in the Y gradient coil 20. The electric current I or the charge moved in the conductor produce Lorentz forces F in the magnetic field and these Lorentz forces are directed perpendicularly to the magnetic field and the current direction. The changes of shape arising from the forces F exerting action on the coils are illustrated in FIG. 3 as an example of an axial "eigenform" of the cylindrical support unit 10. The support unit 10 as a thin-walled cylinder thus performs vibrations in the "eigenform" of the cylinder, in accordance with the signal sequence fed to the gradient coil 20.

The Z gradient coil, which is not illustrated in FIG. 2, produces forces in the direction of the cylinder axis (Z axis) of the support unit 10. In this direction, the support unit is very rigid and thus makes only a negligible contribution to sound emission. In contrast, the cylindrical support unit is not so rigid in the X and Y directions. As a result, the extreme sound levels are produced predominantly through these pairs of coils.

In existing devices, these forces produce the amplitudes illustrated in FIG. 3, e.g. 150 $\mu$m in X and Y directions at approximately 1 kHz at the point of maximum deflection, which is the coil end. In order to counteract these deflections with opposing forces for the purpose of reducing sound emission, a magnetostrictive component which produces a longitudinal elongation in the magnetic field direction is to be provided.

Figure 1:
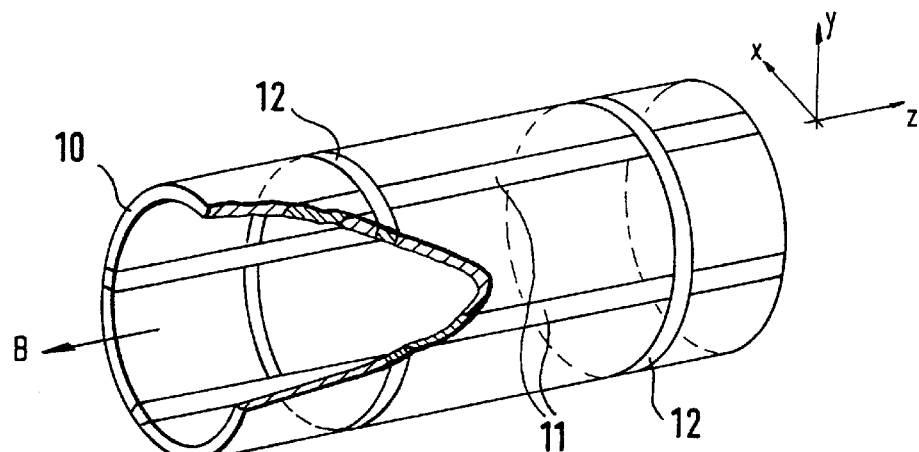
FIG. 1 shows magnetostrictive components on a cylindrical support unit in a three-dimensional, partly cut-away drawing.

In FIG. 1, the magnetostrictive component consists of longitudinal strips 11 made from magnetostrictive material and positioned on the cylindrical shell or surface of the support unit 10, parallel to the cylinder axis (Z axis). These magnetostrictive longitudinal strips 11 can be positioned outside or, preferably, within the cylindrical wall of the support unit 10. In a preferred embodiment of the invention, four longitudinal elements 11 in the form of strips are attached to the support unit 10, at an equal distance around the circumference. It must thereby be borne in mind that elements 11 lying opposite one another must be operated with the same phase and must therefore be incorporated with corresponding polarity.

For the dynamic operation, a pre-tension or bias of the magnetostrictive elements 11 is preferable. The bias can be achieved via the static magnetic field of the tomograph or via a mechanical device for producing bias.

Furthermore, active reinforcement of the support unit 10 can be achieved transversely by means of magnetostrictive elements 12 arranged in a ring around the circumference. Dynamic reinforcement of the cylindrical support unit 10 is thus effected against radial eigenforms.

In a preferred embodiment of the invention, the longitudinally and transversely directed magnetostrictive elements 11, 12 are combined with passive reinforcements, so that forces are produced in the corresponding direction.

The material used for the active reinforcement elements 11, 12 is magnetostrictive material, whose B(H) drawing represents a hysteresis curve and thus shows non-linear magnetic properties. With this material, a dimensional change arises due to an external magnetic field. This geometric dimensional change which is know as the joule effect is called magnetostriction:

$$S = \Delta L = dH + S^H T$$

S=Elongation
l=Length of the material
$\Delta$l=Change in length
d=Magnetostrictive modulus
H=Magnetic field strength
$S^H$=Mechanical compliance (reciprocal value of the E modulus)
T=Mechanical tension According to the invention, nearly all magnetic substances where the magnetostrictive effect is expected, can be used. These are alloys of the metals Fe (Iron), Ni (nickel) and / or Co (cobalt) with the rare ears Sm (samarium), Tb (terbium), Ho (holmium), Dy (dysprosium), Er (erbium) and / or Tm (thulium) as significant components. By means of addition or other elements, the material properties can be changed as desired. For example, the ternary alloy terfenol D $Tb_{1-x} Dy_x Fe_x$ (x=0.27) has extreme longitudinal change properties. However, amorphous iron-based alloys such as Fe—B—Si alloys can also be used on account of reduced losses during magnetisation reversal, higher saturating inductions, lower coercive field strengths and thus much narrower magnetisation loops.

In addition, changes in the magnetisation of the magnetostrictive materials can bring about variations in the material rigidity through a variation of the E modulus. The basis for this is the use of the magneto-elasticity effect (Δ E effect).

Very high regulating or actuating forces can be achieved with suitably formed magnetostrictive materials. Furthermore, the reproducibility of the regulating route is ensured with high accuracy. The electromagnetic efficiency is high. Furthermore, there are no depolarisation effects.

The magnetostrictive material has very short reaction times in the μs field, which means that due to the short dead periods, the material can also be used at higher frequencies (>5 kHz). The material allows high ambient temperatures, e.g. the Curie temperature of 380° C. with terfenol-D.

The present invention therefore reduces the emission of air noise through effective, active damping of vibrations and this achieved at the very point of origin in the support unit for the gradient coils. In the examination zone, the sound level is thus considerably reduced. Neither sensors recording the unwelcome vibrations nor control units and amplifiers attached to the sensors are necessary, since the built-in magnetostrictive material systems are controlled directly via the gradient coils for magnetic resonance examinations. Therefore, the sound reduction measures according to the invention are not very expensive. Furthermore, it must be borne in mind that massive static reinforcements, which increase the weight and volume of the tomograph are not necessary and a cost reduction is thus achieved.

Through the short response times, the existing signal sequences fed to the gradient coil can be used. The measurement programme of nuclear spin tomographs used up to now can thus be performed with the same spatial resolutions, whereas the noise problem in the examination zone is considerably reduced.

KEY

10 Support unit
11 Magnetostrictive longitudinal element
12 Magnetostrictive transverse element
20 Gradient coil
B Magnetic induction
F Lorentz force
I Current
X Physical direction
Y Physical direction
Z Physical direction

We claim:

1. A process for magnetic resonance examinations, in particular nuclear spin tomography, the process comprising the steps of:
   a) producing a static magnetic field in an examination zone;
   b) superposing at least one gradient magnetic field over said static magnetic field;
   wherein unwanted alternating electromagnetic forces are produced as a result of steps a) and b); and
   c) producing, by means of magnetostriction, forces which have a component that opposes the unwanted alternating electromagnetic forces, the forces being produced by said at least one gradient magnetic field;
   wherein said forces act at least one of longitudinally, radially and around the circumference of the examination zone.

2. The process according to claim 1 wherein the forces produced by means of magnetostriction are substantially opposed to the electromagnetic forces.

3. The process according to claim 1 wherein the forces with the opposing components are produced by dimensional variations of the magnetostrictive materials which produce magnetostrictive.

4. The process according to claim 1 wherein the magnitude and direction of the opposing forces is determined by the form and layout of the magnetostrictive materials.

5. The process according to claim 1 wherein the magnitude of the opposing forces is regulated by a mechanical or electromagnetic bias of prestress of the magnetostrictive materials.

6. A device for magnetic resonance examinations, in particular nuclear spin tomography, the device comprising:
   a first generating unit for generating a static magnetic field;
   a second generating unit for generating at least one gradient magnetic field;
   a support unit for supporting the second generating unit; and
   a magnetostrictive material system provided on the support unit.

7. The device according to claim 6, wherein the magnetostrictive material system comprises magnetostrictive components which extend along a surface of said support unit.

8. The device according to claim 6, wherein said support unit has a cylindrical shape, said magnetostrictive components being attached to a surface of said support unit, parallel to an axis of said support unit in a longitudinal direction.

9. The device according to claim 6, wherein said support unit has a cylindrical shape, said magnetostrictive components being attached to a surface of said support unit, in a ring around the circumference of said support unit.

10. The device according to claim 6, wherein the magnetostrictive material system is mechanically biased and attached to the support unit.

11. The device according to claim 6, wherein the magnetostrictive material system is mechanically biased through the static magnetic field and positioned on the support unit.

12. The device according to claim 6, wherein displacement transmission unit are provided on the magnetostrictive material system.

13. The device according to claim 6, wherein the magnetostrictive material is selected from the group consisting of alloys of the metals iron, nickel, cobalt, the rare earths samarium, terbium, holmium, dysprosium, erbium and thulium.

14. The device according to claim 6, wherein the magnetostrictive material system comprises magnetostrictive components which are arranged in strips on said support unit.

15. The device according to claim 6, wherein force transmission units are provided on the magnetostrictive material system.

16. The device according to claim 6, wherein displacement and force transmission units are provided on the magnetostrictive material system.

* * * * *